United States Patent [19]
Muller et al.

[11] Patent Number: 5,891,807
[45] Date of Patent: Apr. 6, 1999

[54] FORMATION OF A BOTTLE SHAPED TRENCH

[75] Inventors: K. Paul Muller, Wappingers Falls; Rajiv M. Ranade, Fishkill; Stefan Schmitz, Pleasant Valley, all of N.Y.

[73] Assignees: Siemens Aktiengesellschaft, Munich, Germany; International Business Machines Corporation, Armonk, N.Y.

[21] Appl. No.: 937,526

[22] Filed: Sep. 25, 1997

[51] Int. Cl.⁶ .......................... H01L 21/306; C03C 25/06; B44C 1/22
[52] U.S. Cl. .......................... 438/713; 438/714; 438/715; 438/732; 438/733; 438/734
[58] Field of Search .................................. 438/714, 713, 438/700, 701; 216/17

[56] References Cited

U.S. PATENT DOCUMENTS

| | | | |
|---|---|---|---|
| 4,726,879 | 2/1988 | Bondur et al. | 438/712 |
| 4,855,017 | 8/1989 | Douglas | 438/695 |
| 5,013,400 | 5/1991 | Kurasaki et al. | 438/713 |
| 5,403,435 | 4/1995 | Cathey et al. | 438/669 |
| 5,605,600 | 2/1997 | Muller et al. | 438/695 |

OTHER PUBLICATIONS

Ozaki, T., et al., "0.228 Micrometer–square Trench cell technologies with Bottle–Shaped Capacitor for 1 Gbit DRAMs", Technical Digest/International Electron Devices Meeting (IEDM–95), 10–13 Dec. 1995, Washington DC, pp. 27.3.1–27.3.4, 1995.

*Primary Examiner*—Benjamin Utech
*Assistant Examiner*—Donald L. Champagne
*Attorney, Agent, or Firm*—Stanton C. Braden

[57] ABSTRACT

A method for forming a bottle shaped trench 20 in a semiconductor substrate 10 includes reactive ion etching a trench having a tapered top portion 25 in the semiconductor device and continuing to reactive ion etch while increasing the temperature of the semiconductor device to impart a reentrant profile 22 to the trench.

16 Claims, 1 Drawing Sheet

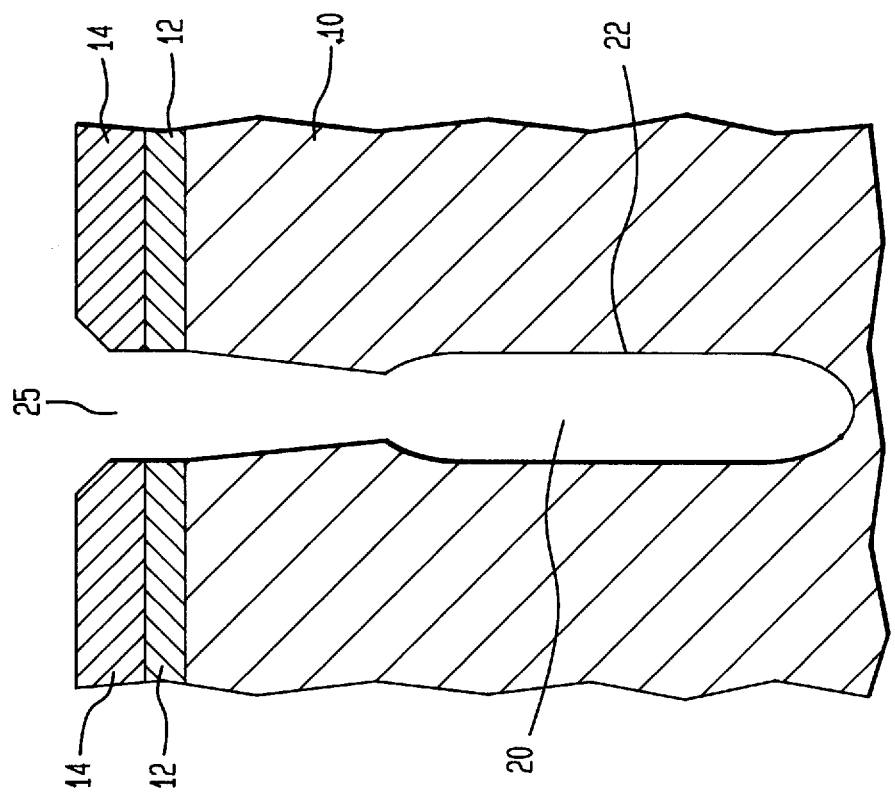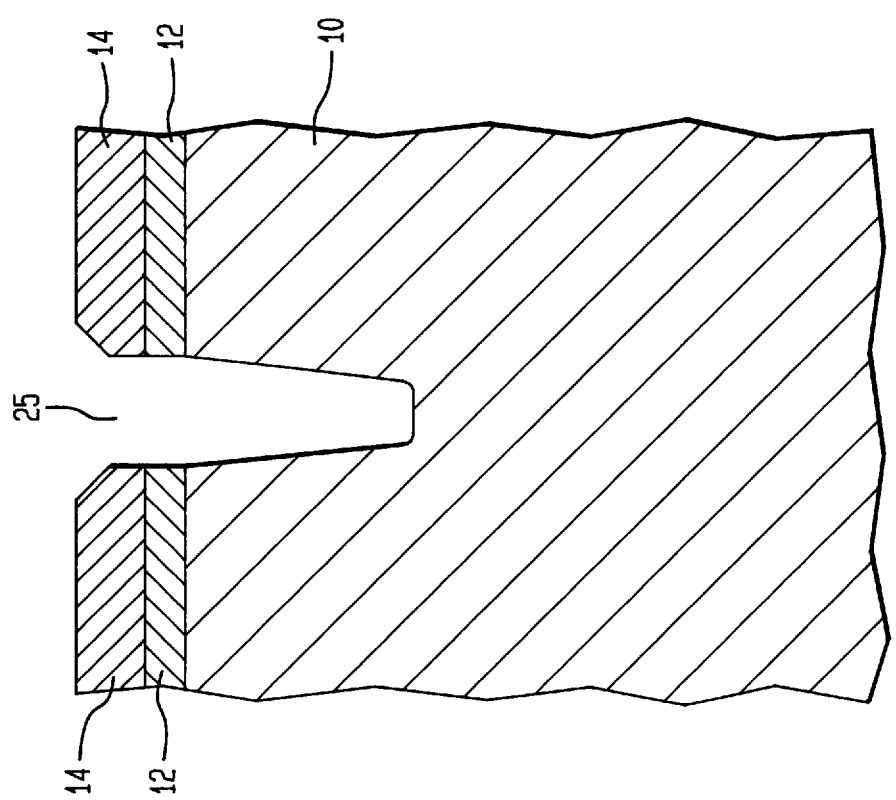

FORMATION OF A BOTTLE SHAPED TRENCH

BACKGROUND

1. Technical Field

A method for forming a bottle shaped trench in a semiconductor substrate is described herein. The term "bottle shaped trench" as used herein refers to a trench having an upper part defined by a positively sloped periphery and a lower part defined by a negatively sloped periphery so as to define a smaller diameter neck portion between the upper and lower parts of the trench. More particularly, a bottle shaped trench is formed in a semiconductor substrate using a single etch process by varying the etch conditions.

2. Background of Related Art

Methods for etching a deep trench to provide storage capacitance in a semiconductor device are known. An example of such a method is reactive ion etching. Generally, reactive ion etching is a method which first creates a plasma gas composition in a reaction chamber by a radio frequency (RF) energy field. The plasma gas composition will usually contain neutrals, radicals and ions. The latter can be accelerated by the electric field toward the surface of the semiconductor substrate. Radicals reach the semiconductor surface by diffusion. Upon colliding with the surface of the semiconductor device, the accelerated ions together with the radicals remove material from the exposed surface of the semiconductor device. The ions together with the radicals react with atoms or molecules in the material to be etched to produce intermediate products or volatile by-products which can be removed from the reaction chamber. A sidewall passivating film normally forms from the reaction between the intermediate products or volatile by-products with species from the mask material or the process gases. This film tends to inhibit etching, shrink the physical size of the mask opening and thereby affect trench shape.

To further increase the storage capacitance in a semiconductor device, a bottle shaped trench has been developed. Ozaki et al., 0.228 $\mu m^2$ *Trench Cell Technologies with Bottle-Shaped Capacitor for* 1 *Gbit DRAMs,* Technical Digest; Vol. 27.3.1, p. 661 (1995), discloses a multi-step method for forming a bottle shaped trench. The Ozaki et al. method forms a bottle shaped trench by (1) forming a trench by conventional DT silicon reactive ion etching; (2) forming a collar oxide at the upper portion of the trench by selective oxidation; (3) depositing into the trench in-situ phosphorous doped polysilicon; (4) annealing phosphorous dope into the trench sidewall at the bottom portion of the trench; and (5) removing the polysilicon by chemical dry etching to enlarge the diameter of the bottom portion of the trench.

It would be desirable to provide a more expedient and simplified method for forming a bottle shaped trench in a semiconductor device to increase the storage capacitance thereof. The method of this invention allows to form bottle shaped trenches during the deep trench etch process without any additional processing steps.

SUMMARY OF THE INVENTION

A novel method for forming a bottle shaped trench in a substrate has been discovered which includes the steps of:

a) etching at a first temperature to form a trench having a tapered top portion; and b) continuing to etch at a second temperature, the second temperature being higher than the first temperature.

In an alternative embodiment, in place of or in addition to the change in temperature, the first etch step is conducted at a first pressure and etching is continued at a second pressure that is less than the first pressure.

BRIEF DESCRIPTION OF THE DRAWINGS

FIG. 1A is a schematic cross-sectional view of the trench having a tapered top portion formed after the first stage of etching in a preferred method in accordance with this disclosure; and FIG. 1B is a schematic cross-sectional view of the bottle shaped trench formed by the second stage of etching in a preferred method according to the present disclosure.

DESCRIPTION OF THE INVENTION

The invention relates to the formation of a bottle shaped trench. The trench is use to form a trench capacitor employed in an integrated circuit (IC). Such IC is, for example, a random access memory (RAM), a dynamic random access memory (DRAM), a synchronous DRAM (SDRAM), and a read only memory (ROM). Other IC such as an application specific IC (ASIC), a merged DRAM-logic circuit (embedded DRAM), or any other logic circuit is also useful.

Typically, numerous ICs are formed on the wafer in parallel. After processing is finish, the wafer is diced to separate the ICs to individual chips. The chips are then packaged, resulting in a final product that is used in, for example, consumer products such as computer systems, cellular phones, personal digital assistants (PDAs), and other electronic products.

In accordance with the invention, the bottle shaped trench is formed using a single process. In one embodiment, the formation of the trench involves a two stage etch process. The first stage forms an upper portion of the trench and the second stage forms a bottom portion, wherein the bottom portion is formed by varying the etch parameters to result in a reentrant or bottle shaped profile.

The fabrication of the semiconductor device is typically conducted in successive stages, one or more of which can involve depositing of desired layers of selected material onto a substrate, such as a silicon wafer using techniques known to those skilled in the art. Other substrates such as gallium arsenide, germanium, silicon on insulator (SOI), or other semiconductor materials are also useful. The substrate, for example, may be lightly or heavily doped with dopants of a predetermined conductivity to achieve the desired electrical characteristics. For example, referring to FIG. 1A, a pad stack is formed on the substrate. The pad stack are those typically used to form deep trenches. Such a pad stack includes, for example, a silicon nitride layer 12 is deposited on silicon wafer 10 and a dielectric layer (e.g., TEOS) layer 14 is deposited upon layer 12. Collectively, layers 12 and 14 will form a hard mask for the deep trench etching step. The nitride layer serves as a polish stop layer for subsequent polish steps. To reduce stress and promote adhesion of the nitride layer to the substrate, an oxide layer (not shown) is provided therebetween. Then, a resist layer (not shown) can be formed in a pattern on the surface of the semiconductor device by microlithographic techniques. Forming a pattern typically involves coating at least a portion of the semiconductor device with a resist material and then exposing in the appropriate pattern. The resist can then be developed in accordance with methods well known in the art to remove either the exposed or unexposed portions, depending on whether a positive or negative resist is used. Once the resist is developed, subsequent processing steps then can be performed to locally impact the appropriate physical changes, e.g., a bottle shaped trench of which the method for forming will be described herein, in the semiconductor material to yield a desired device structure. Materials and methods suitable for forming and patterning the resist layer as well as developer compositions are known to those skilled in the art. Such conventional materials can be used herein.

Once the resist is developed, the semiconductor device can be subjected to an etching method, e.g., reactive ion etching, plasma etching, etc., to perform the mask open etch, i.e., transfer the resist pattern into the TEOS 14 and the nitride layer 12 (hard mask). Once the hard mask is opened, the semiconductor device can be subjected to etching to form the bottle shaped trench of this invention. A reactive ion etch, for example, is employed to form the bottle shaped trench in a semiconductor device. Other anisotropic etch techniques are also useful. In one embodiment, the reactive ion etch is conducted in two stages, each stage being conducted with different parameters. Parameters that can be varied include, for example, radio frequency power, reaction chamber pressure, backfilling pressure, etc., as described hereinbelow.

As seen in FIG. 1A, the reactive ion etch parameters are adjusted such that the first stage advantageously forms a trench having a tapered top portion 25 and the second stage will advantageously expand the lower portion of the trench to form the bottle shaped trench. The tapered sidewall profile facilitates filling of the trench with materials such as polysilicon without voids and seams in the tapered portion of the trench.

To begin the first stage of the reactive ion etching (e.g., plasma etching, reactive ion etching, ect.) to form the trench, the substrate is placed on a chuck (not shown) in a reaction chamber (not shown). The reaction chamber can be any conventional reaction chamber known to one skilled in the art. Once the substrate is in place on the chuck, there will normally be a gap between the frontside of the chuck and the backside of the substrate. Typically, an inert gas, e.g., helium, argon, etc., is introduced into the gap at a predetermined backfilling pressure. The gas promotes the cooling mechanism for the semiconductor device. The backfilling pressure during the first stage etching will ordinarily range from about 5 torr to about 15 torr and preferably from about 7 torr to about 10 torr. Techniques for controlling the backfilling pressure are within the purview of one skilled in the art.

Following the placement of the substrate in the reaction chamber, a plasma gas composition is introduced into the reaction chamber. As one skilled in the art will readily appreciate, the reaction chamber will be substantially free of all impurities before introducing the plasma gas composition into the reaction chamber by employing, e.g., a vacuum. Suitable plasma gas compositions for this invention include any conventional plasma gas composition known to one skilled in the art. A preferred plasma gas composition includes HBr, $NF_3$ and either a premixed $He/O_2$ or pure $O_2$. Particularly useful plasma gas compositions have a relative concentration of from about 69% to about 90% volume percent for HBr, of from about 7.2 to about 20.0 volume percent for $NF_3$ and of from about 0 to about 6 volume percent for $O_2$.

As will be appreciated by those skilled in the art, a native oxide might form upon exposure of the wafer to the atmosphere after the mask open etch. Thus, it might be necessary to employ initial etch conditions that will break through any native oxide that might be present.

Typically, the plasma gas composition will by subjected to radio frequency (RF) energy to generate ions and/or radicals.

The power of the RF energy employed to generate ions during the first stage of the deep etch will ordinarily range from about 400 watts to about 1000 watts and preferably from about 600 watts to about 900 watts. A magnetic field is generated within the reaction chamber to densify the plasma. The magnetic field strength employed during the first stage etching can range from about 15 gauss to about 170 gauss and preferably from about 100 gauss to about 170 gauss. Referring to FIG. 1A, the ions bombard the patterned areas of the resist layer 16 on the frontside of the semiconductor device to form a trench. When bombarding the patterned areas of the resist layer 16 to form the trench, a tapered top portion 25 is formed on the trench. A sidewall passivation film will begin to form in the tapered top portion 25 of the trench 20 during the bombardment of the ions on the semiconductor device. The rate at which the passivation film is formed determines the tapered profile of the trench. The reaction chamber pressure employed during the first stage etching will ordinarily range from about 20 mtorr to about 175 mtorr and preferably from about 110 mtorr to about 150 mtorr. The temperature of the semiconductor device during the first stage etch should be maintained in the range from about 20° C. to about 100° C. and preferably from about 50° C. to about 90° C. Techniques for measuring and monitoring the temperature of the semiconductor device and for controlling the various other parameters to form a desired trench profile in the upper portion are within the purview of one skilled in the art.

Generally, the first stage of the reactive ion etching method will form a trench having a tapered top portion 25. The first stage etch will normally be conducted for a time period ranging from about 60 seconds to about 180 seconds and preferably from about 110 seconds to about 125 seconds. The depth of the trench formed during the first stage etch can ordinarily range from about 1 $\mu$m to about 2 $\mu$m and preferably from about 1.25 $\mu$m to about 1.75 $\mu$m. It is to be understood that at the completion of the first stage of the deep trench etch only the tapered top portion 25 is generated having a preferred depth of about 1.5 $\mu$m. Of course the actual depth of the trench formed during the first stage depends on design parameters.

Following the completion of the formation of the tapered top portion 25 of the trench, the conditions of the reactive ion etch process are changed. After a short transitional step, second stage etch conditions are chosen which impart a reentrant profile or bottle shape 22 to the trench 20 (See FIG. 1B). The second stage etch is initiated by increasing the temperature of the surface of the semiconductor device or decreasing the pressure within the reaction chamber, or both.

By increasing the temperature of the semiconductor device, the rate at which the sidewall passivation film is formed in the trench 20 will be reduced to a level sufficient to allow for some degree of lateral reactive ion etching in addition to the predetermined vertical reactive ion etching. The temperature is typically increased by about 80° C. compared to the first stage temperature, so that the second stage etch is conducted at a temperature in the range of from about 100° C. to about 180° C., preferably from about 130° C. to about 150° C., and more preferably from about 138° C. to about 142° C.

The temperature of the semiconductor device can be increased in any manner. In particularly useful embodiments, the temperature is increased by decreasing the backfilling pressure, or increasing the RF power or both. As noted above, the gas introduced into the gap between the frontside of the chuck and the backside of the semiconductor device controls the cooling of the semiconductor device:

The heat transfer between the backside of the wafer and the frontside of the chuck can be modulated by varying the He backfilling pressure, thus the wafer surface temperature can be rapidly adjusted. As the backfilling pressure is increased, the temperature of the semiconductor device is decreased and as the backfilling pressure is decreased the temperature of the semiconductor device is increased. Generally, for the second stage etch, the backfilling pressure can be decreased by about 50 to 100%, preferably by about 75% for a Magnetically Enhanced Reactive Ion Etching (MERIE) and 100% for Dipole Ring Magnetic etching (DRM) compared to the backfilling pressure used during the first stage etch. Thus, for the second stage etch, the backfilling pressure will range from about 1.5 torr to about 2.5 torr with a preferable setting of about 2 torr for the MERIE case and about 0 torr for the DRM case.

By increasing the RF power, the ions will bombard the patterned areas of the resist layer on the frontside of the semiconductor device at a faster rate at the same time the ion energy is increased. Both factors will increase the temperature of the semiconductor device. During the second stage of etching the RF power can be increased by about 10 to about 40%, preferably about 37% for the MERIE case and about 11% for the DRM case compared to the RF power settings used during the first stage etch. Accordingly, during the second stage etch, the RF power can range from about 900 watts to about 1500 watts and preferably from about 1000 watts to about 1100 watts.

In an alternative embodiment that is particularly useful in the MERIE case, a reduction in chamber pressure going from the first stage etching to the second stage etching is employed to change the ion angular and ion energy distributions. With reduced pressure the ions will reflect off the tapered top portion 25 of the trench 20 to bombard the sidewalls of the trench 20 below the tapered top portion 25. Since the rate of forming the sidewall passivation film in the trench 20 has been reduced, the ions can then etch the material of the sidewall of the trench 20 to advantageously form the bottle shaped trench in the semiconductor device. The reaction chamber pressure can ordinarily be decreased by an amount ranging from about 15 mtorr to about 65 mtorr and preferably from about 30 mtorr to about 50 mtorr.

The time sufficient to etch the bottle shape 22 of trench 20 in the semiconductor device after completion of the first stage etch can range from about 200 seconds to about 320 seconds and preferably from about 275 seconds to about 290 seconds. Thus, the overall time for the two stage etch employed in the method described herein will range from about 260 seconds to about 500 seconds.

Although the invention has been described in its preferred form with a certain degree of particularity, obviously many changes and variations are possible therein. It is therefore to be understood that the present invention may be practiced otherwise than as specifically described herein without departing from the spirit and scope thereof.

The following examples are illustrative of the method of the invention.

EXAMPLE 1

The following is an illustration of etching conditions for a Magnetically Enhanced Reactive Ion Etching (MERIE) that can be used in a process for formation of a 1 G bottle shaped trench.

|  | Break Through | First Stage Conditions (Formation of Trench with Top Tapered Portion) | Transition Period | Second Stage Conditions (Formation of Bottle Shaped Trench) |
| --- | --- | --- | --- | --- |
| Reaction Chamber Pressure (mtorr) | 20 | 110 | 110 | 110 |
| HBr (sccm) | 20 | 55 | 55 | 55 |
| NF$_3$ (sccm) | 5 | 8 | 8 | 8 |
| He/O$_2$ (sccm) | 0 | 16 | 10 | 7 |
| RF Power (watt) | 600 | 800 | 800 | 1100 |
| Magnetic Field Strength (gauss) | 15 | 100 | 100 | 75 |
| He Backfilling Pressure (torr) | 8 | 8 | 4 | 2 |
| Etch Time (sec) | 25 | 100 | 25 | 250 |

EXAMPLE 2

The following is an illustration of etching conditions for a Dipole Ring Magnetic (DRM) etching that can be used in a process for formation of a 1 G bottle shaped trench. DRM etching is carried out at a constant magnetic field strength of 170 gauss.

|  | Break Through | First Stage Conditions (Formation of Trench with Top Tapered Portion) | Transition Period | Second Stage Conditions (Formation of Bottle Shaped Trench) |
| --- | --- | --- | --- | --- |
| Reaction Chamber Pressure (mtorr) | 150 | 150 | 150 | 150 |
| HBr (sccm) | 75 | 150 | 150 | 150 |
| NF$_3$ (sccm) | 8 | 14.5 | 12 | 13 |
| O$_2$ (sccm) | 0 | 6 | 4 | 6 |
| RF Power (watt) | 900 | 900 | 900 | 1000 |
| He Backfilling Pressure (torr) | 10/40 | 10/40 | 4/15 | 0/0 |
| Etch Time (sec) | 5 | 105 | 20 | 270 |

What is claimed is:

1. A method for forming a bottle shaped trench in a substrate comprising:
   first etching at a first temperature to form a trench in the substrate having a tapered positively sloped top portion; and
   second etching at a second temperature to form a negatively sloped bottom portion with a relatively narrow diameter neck portion between the positively sloped top portion and the negatively sloped bottom portion, the second temperature being higher than the first temperature.

2. The method of claim 1 wherein both the first and second etchings comprise plasma etching.

3. The method of claim 1 wherein both the first and second etchings comprise reactive ion etching.

4. The method of claim 3 wherein the second temperature is provided by reducing backfilling pressure.

5. The method of claim 4 wherein backfilling pressure is reduced by about one order of magnitude from the first etching to the second etching.

6. The method of claim 4 wherein backfilling pressure is reduced from about 10 torr during the first etching to about 1 torr during the second etching.

7. The method of claim 3 wherein during the second etching, the second temperature is provided by increasing RF power.

8. The method of claim 7 wherein RF power is increased an amount from about 35% to about 45% from the first etching to the second etching.

9. The method of claim 3 wherein during the second etching, the second temperature is provided by reducing backfilling pressure and increasing RF power.

10. The method of claim 1, wherein the first etching is carried out at a first pressure and the second etching is carried out at a second pressure, the second pressure being lower than the first pressure.

11. The method of claim 10 wherein the second pressure is from about 30 to about 50 mtorr lower than the first pressure.

12. The method of claim 1 wherein the second temperature is from about 52 to about 88 degrees higher than the first temperature.

13. The method of claim 1 wherein the first and second etchings are performed under such conditions as to form and maintain a sidewall passivation film on at least the top portion of the trench sufficient to maintain the positive slope of the top portion while forming the negatively sloped bottom portion.

14. A method for forming a bottle shaped trench in a substrate comprising:

a) first etching at a first RF power level and first backfill pressure for a first duration of etch time to form a tapered top portion of the bottle shaped trench terminating in an opening, the top portion being defined by a positively sloped periphery; then b) second etching at a second RF power level and second backfill pressure for a second duration of etch time to form a reduced diameter intermediate neck portion of the bottle shaped trench, the second backfill pressure being less than the first backfill pressure, and the second etch time being less than the first etch time; then c) third etching at a third RF power level and third backfill pressure for a third duration of etch time to form a bottom portion of the bottle shaped trench defined by a negatively sloped periphery such that the neck portion of the bottle shaped trench is between the top portion and the bottom portion of the bottle shaped trench, the third RF power level being greater than the first power level, the third backfill pressure being less than the second backfill pressure, and the third etch time being greater than the first etch time.

15. The method of claim 13 wherein the first, second and third etching steps are performed in a magnetic field.

16. The method of claim 13 wherein the second RF power level is the same as the first RF power level.

* * * * *